(12) United States Patent
Gruening-von Schwerin et al.

(10) Patent No.: US 7,804,708 B2
(45) Date of Patent: Sep. 28, 2010

(54) INTEGRATED CIRCUIT INCLUDING AN ARRAY OF MEMORY CELLS AND METHOD

(75) Inventors: Ulrike Gruening-von Schwerin, Munich (DE); Lothar Risch, Neubiberg (DE); Peter Baars, Dresden (DE); Klaus Muemmler, Dresdem (DE); Stefan Tegen, Dresden (DE); Thomas Happ, Dresden (DE)

(73) Assignee: Qimonda AG, Munich (DE)

( * ) Notice: Subject to any disclaimer, the term of this patent is extended or adjusted under 35 U.S.C. 154(b) by 159 days.

(21) Appl. No.: 12/182,698

(22) Filed: Jul. 30, 2008

(65) Prior Publication Data

US 2010/0027325 A1     Feb. 4, 2010

(51) Int. Cl.
*G11C 11/00* (2006.01)
*G11C 5/06* (2006.01)
*H01L 29/02* (2006.01)

(52) U.S. Cl. .................. 365/163; 365/72; 365/148; 365/175; 257/2; 257/202; 257/E21.001; 257/E21.602; 257/E47.001

(58) Field of Classification Search .................. 365/63, 365/72, 148, 163, 175; 257/2, 202, E47.001, 257/E21.001, E21.602
See application file for complete search history.

(56) References Cited

U.S. PATENT DOCUMENTS

| | | | |
|---|---|---|---|
| 2008/0258129 A1* | 10/2008 | Toda | 257/5 |
| 2009/0251952 A1* | 10/2009 | Ma et al. | 365/163 |
| 2009/0261312 A1* | 10/2009 | Gruening-von Schwerin | 257/2 |

\* cited by examiner

*Primary Examiner*—Ly D Pham
(74) *Attorney, Agent, or Firm*—Dicke, Billig & Czaja, PLLC

(57) ABSTRACT

An integrated circuit including an array of memory cells and method. In one embodiment, each memory cell includes a resistively switching memory element and a selection diode for selecting one cell from the plurality of memory cells. The memory element is coupled with its top to a first selection line and with its bottom side to the selection diode, the diode further being coupled to the bottom side of a second selection line.

6 Claims, 11 Drawing Sheets

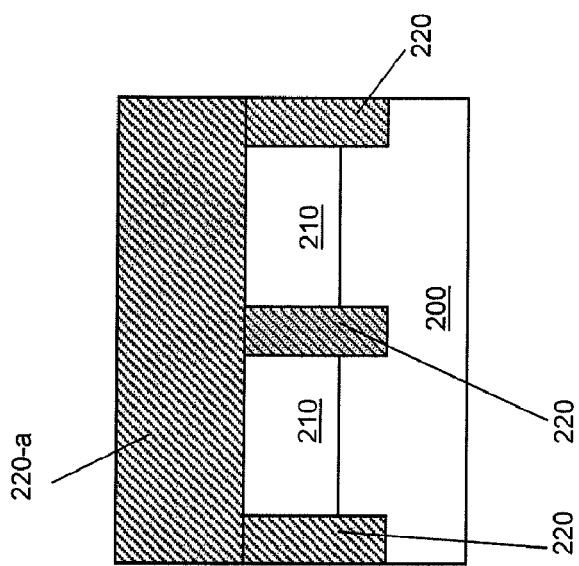
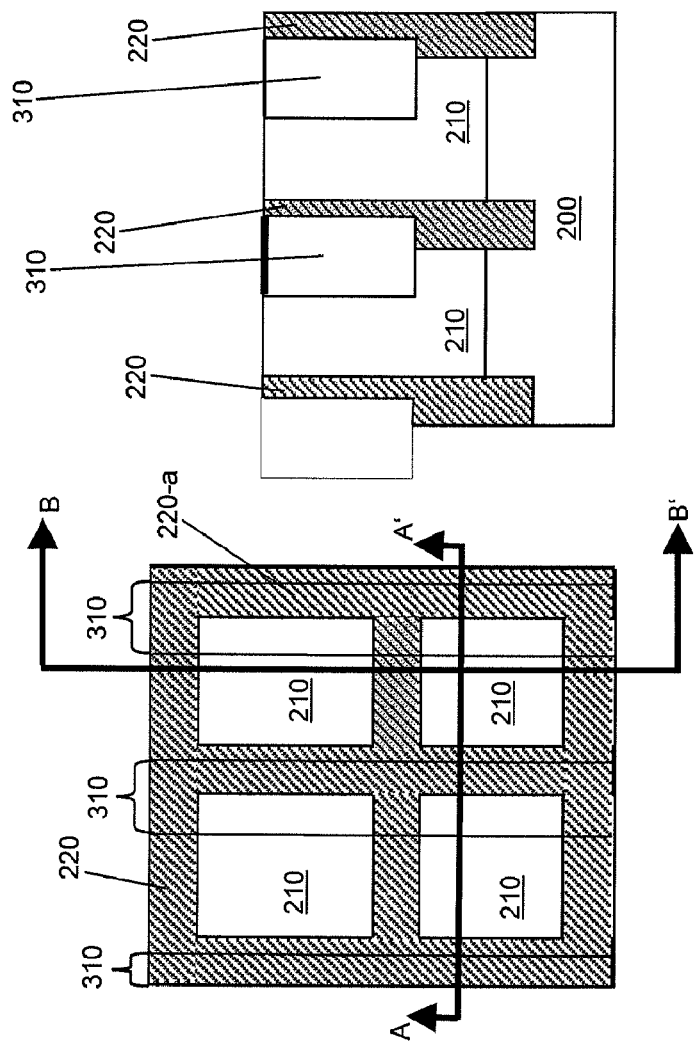
Fig. 3c
Fig. 3b
Fig. 3a

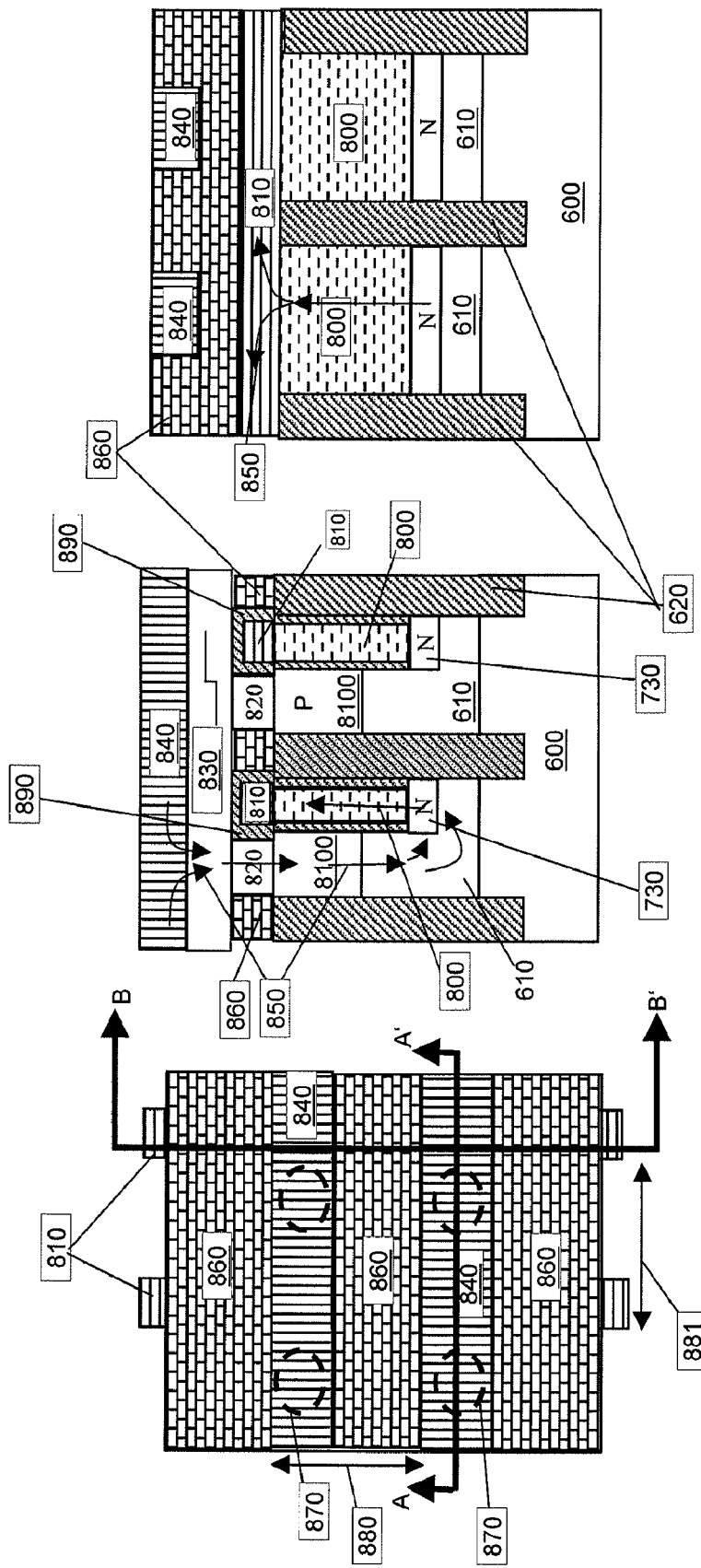

INTEGRATED CIRCUIT INCLUDING AN ARRAY OF MEMORY CELLS AND METHOD

BACKGROUND

The invention relates to an array of memory cells including diodes to select one of the memory cells and a corresponding method for forming the array.

In resistively switching memory cells, for example, phase change random access memory (PCRAM), the information is stored in a volume of switching active material, wherein the switching active material may switch between two states. In a first state the switching active material may have a high resistance, i.e. a low conductivity, and a lesser resistance, i.e. a higher conductivity, in a second state. Accordingly, the information of a bit may be assigned to a PCRAM cell, wherein the state of the cell reflects the status of the bit. Although the invention is described for PCRAM cells in the following the structure and methods can be used for any random access memory including diodes as selection means.

For reading a resistively switching memory cell the resistance of the volume of resistively switching material is sensed, i.e. the conductivity is sensed. This can be achieved, for example, by applying a predefined voltage to the cell and sensing the amplitude of the current flowing through the cell. For switching the state of a resistively switching memory cell a high current is sent through the volume of switching active material in order to heat and subsequently change the material from a one state to the other. Accordingly a selection diode comprised in the cell should be able to send a strong current through the cell.

An ever-challenging problem in the technology of memory is to reduce the size of a memory cell for increasing the density of memory cells, wherein at the same time an access device for selecting one cell must enable a high current through the cell.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3a, 3b, 3c illustrate a top-down view on and cross sectional views through one embodiment in a following processing stage.

FIGS. 8a, 8b, 8c illustrate a top-down view on and cross sectional views of one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
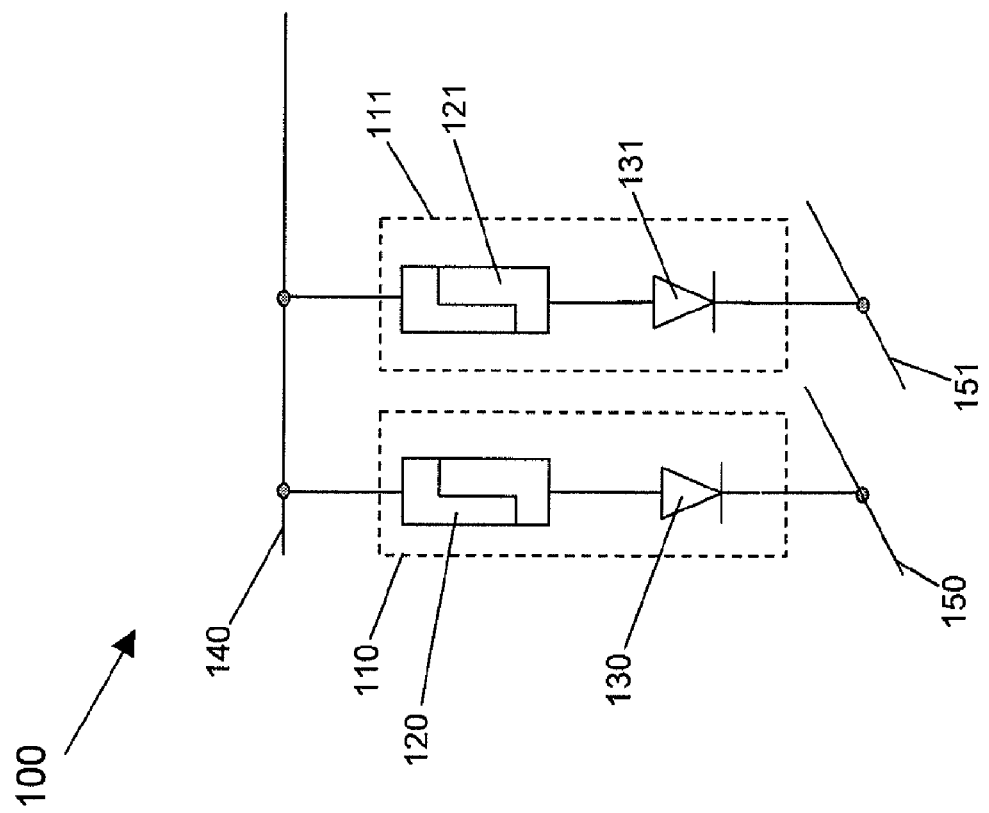
FIG. 1 illustrates one embodiment of a schematic circuit diagram of an integrated circuit including two memory cells representing an array of several memory cells.

The electrical circuit 100 illustrated in FIG. 1 includes memory cells 110, 111 exemplifying a plurality of identical memory cells arranged in an array of memory cells, for example, in an integrated circuit. One or more embodiments of the resistively switching memory elements, for example, include a volume of phase change material, the cells thus being PCRAM. Each cell includes a volume of switching active material 120, 121, i.e. a resistively switching memory element, and a diode 130, 131 for selecting one memory element from the plurality of memory elements. The memory elements are coupled to a first selection line 140 and to an associated diode, each of which in turn is coupled to a second selection line 150, 151. In the direction of the first selection lines a plurality of memory cells is coupled to one of these lines, wherein each memory cell is coupled to a different selection line. Vice versa in the direction of a second selection line a plurality of memory cells is coupled to one second selection line, and wherein each cell is coupled with its residual contact to a different first selection line.

An individual memory cell 110 is thus coupled to an individual pair of one second selection line 150 and one first line 140 and may be selected by selecting the pair of a first and a second selection line. For operating a cell the voltage of the associated first selection line is raised until the diode reaches the conducting state, such that a current flows from the first selection line through the memory element and the diode to the second selection line, which dissipates the current. It is apparent that the direction of the diode and thus the direction of the current flow may easily be inversed by exchanging the p+ and the n doped regions of the diode and the direction of the applied voltage respectively.

The subsequently described drawings illustrate processing stages of the embodiments when producing the array of memory cells, and in one embodiment the array of selection diodes.

Figure 2C:
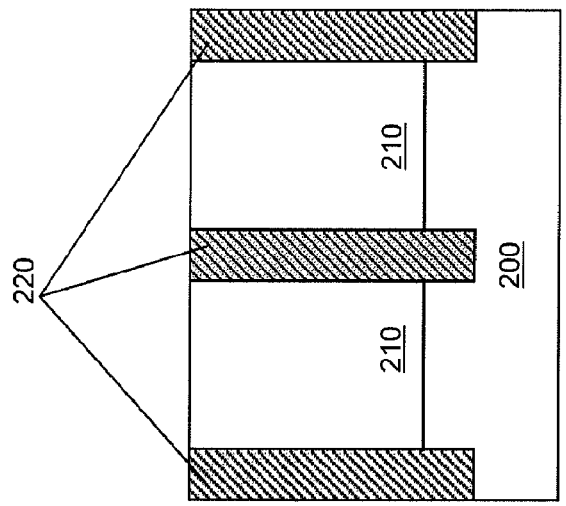
FIGS. 2a, 2b, 2c illustrate one embodiment of a schematic top-down view onto a cutout of a first layout of an array of memory cells and cross sectional views at an early processing stage.
Figure 2B:
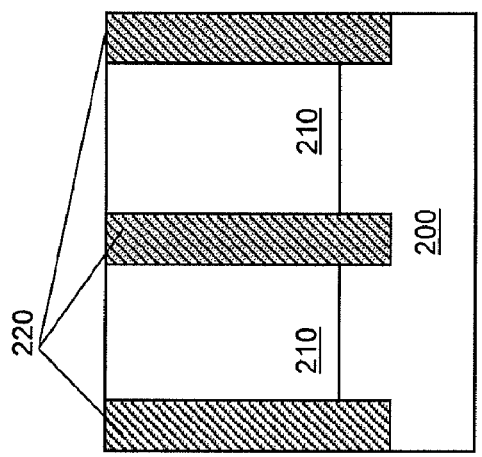
Figure 2A:
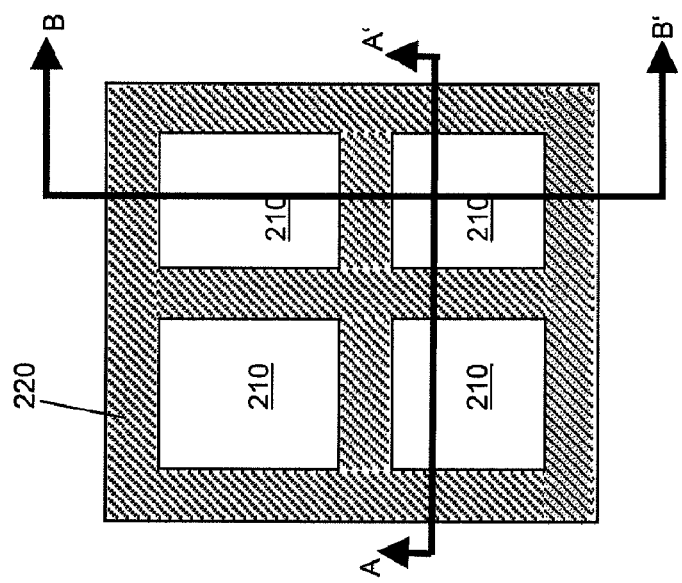

FIG. 2a illustrates a top-view on and FIGS. 2b, 2c illustrate cross sectional views through a structure of a first embodiment along cut lines A-A' and B-B' respectively after having performed first processes. In this and the subsequent figures illustrating the embodiments the cut lines are maintained stationary, i.e. line A-A' runs parallel to and through a first selection line 140 and line B-B' runs parallel to and through a second selection 150.

In all embodiments described herein the substrate may be a lightly p doped silicon, which may be of weak inherent conductance. Unless otherwise explicitly described in the following this and subsequent etching processes in order to form trenches in the substrate and/or through other materials may be performed using conventional processes.

In the early processes the substrate 200 either is lightly p doped and optionally may receive an appropriate well doping by deep implanting appropriate ions into the substrate. In one embodiment, a more heavily doped substrate can be used, followed by a lighter doped epitaxial top layer, in which the active regions can be formed.

The substrate is n doped in the regions where the memory array is to be formed above the p doped region in order to form an n doped region 210 between the p doped substrate and the surface of the chip.

A shallow trench isolation (STI) 220 is produced, wherein half of the STI trenches are parallel to a first selection line and the other trenches are arranged perpendicular, wherein the trenches—with reference to a substrate plane—extend into the p doped substrate 200 thus forming a mesh separating the n doped substrate 210 into discrete areas.

The isolating trenches 220 may be etched by any conventional processing method and may be filled by any conventional method with any suitable isolating material, for example, an oxide such as silicon dioxide.

Note that the sequence of producing the n doped substrate and producing the isolating STI trenches may be changed deliberately.

FIG. 2a illustrates a top view on the chip showing the mesh of STI trenches 220, wherein the trenches 220 separate the n doped upper region of the substrate into discrete areas. Note that diverging from the illustrated shape the discrete areas of n doped substrate 210 may have a rounded shape as ridges and edges tend to be rounded with decreasing dimensions.

FIGS. 2b and 2c illustrate the cross-sectional views along cut lines A-A' and B-B' respectively. STI trenches 220 extend into p doped substrate thus separating and isolating adjacent areas of n doped substrate from each other.

FIGS. 3a to 3c illustrate the structure etching a trench into the discrete, n– doped substrate and the STI.

For etching a selection line trench 310 a mask, which may be any suitable mask, is deposited and structured using conventional lithographic method processes. In one embodiment and as illustrated in FIGS. 3a and 3b the width of trench 310 is chosen such that—in the drawing on the left side—there remains a portion of n-doped substrate 210 between trench 310 and an adjacent STI isolation 220. In an alternative embodiment the location and width of the trench may be chosen such that also a portion of isolation running parallel to the trench is etched in order to increase the width of the channel. In this case the etching is non-selective to the material of STI 220, i.e. non-selective to silicon dioxide. That is, as illustrated in FIG. 3b the upper portion of isolation 220 is partially removed leaving a thin wall of isolation. The depth of the trench is chosen such that the depth of the trench exceeds the depth of p+-doped area 300 but does not extend into the p– doped substrate 200, thus leaving some n– doped substrate below trench 310.

In one embodiment, but not illustrated in the drawings, the etching of selection line trenches 310 may be selective to the material of STI 220, such that the STI 220-a remains unaffected and selection line trench 310 adjoins STI 220.

FIG. 3a illustrates that a plurality of parallel selection line trenches 310 is formed, which in this embodiment run through n doped substrate 210 and STI 220. FIG. 3b illustrates the vertical extension of trench 310. The depth of trench 310 is chosen such that some n-doped substrate is maintained below trench 310. FIG. 3c illustrates that the trench continues through isolation trenches 220 in order to widen the trench. Note that isolation 220-a becomes visible in the direction of cut line B-B'.

Figures 4A, 4B, 4C:
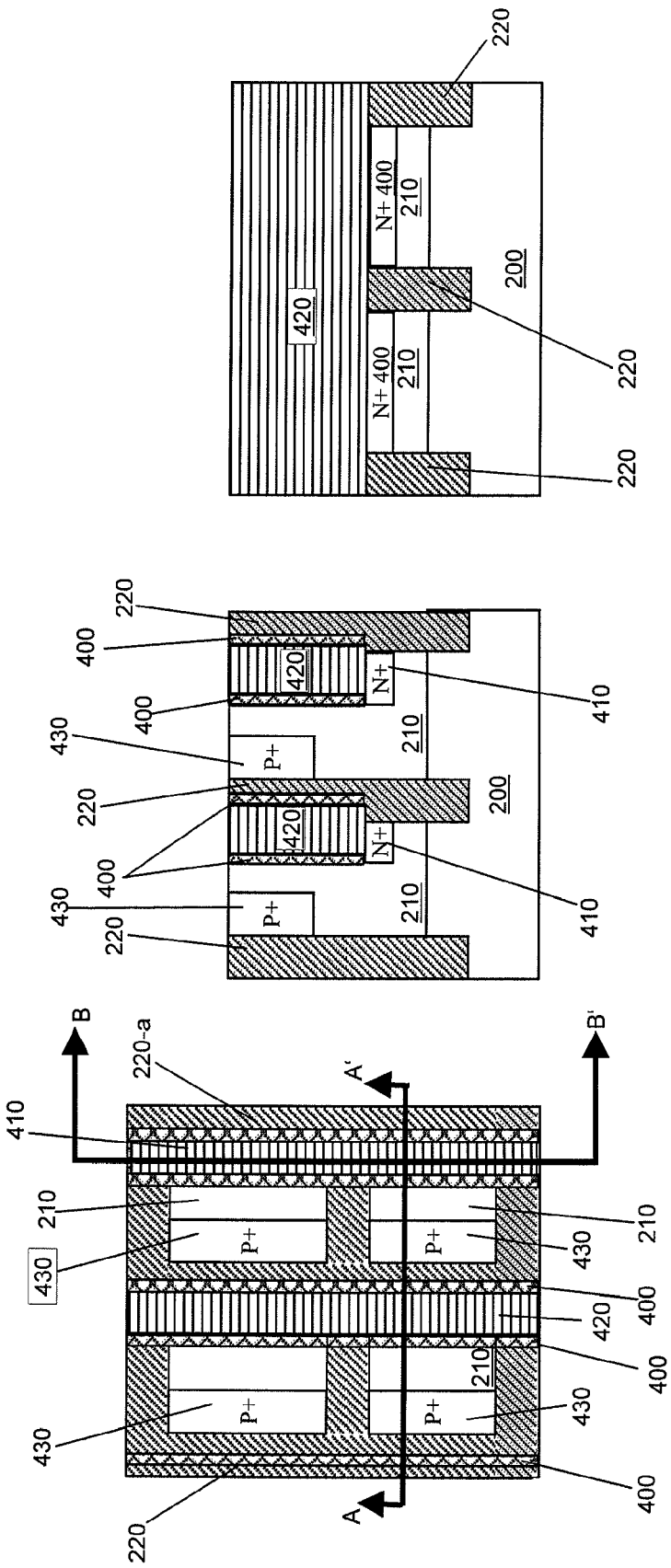
FIGS. 4a, 4b, 4c illustrate a top-down view on and cross sectional views through one embodiment following the stage of FIG. 3.

FIG. 4 illustrate the structure after subsequent method processes. After trenches 310 are etched the sidewalls of the trenches are covered with an isolating liner, for example, by producing isolating spacers 400 on the sidewalls, which can be achieved by depositing a thin liner of suitable isolating material on the chip, such as silicon dioxide or silicon nitride or a combination thereof, which is then anisotropically etched.

Then the bottom of trench 310 is n+-implanted to produce an n+-doped area 410, wherein area 410 vertically starts at the bottom side of trench 310 and extends into the substrate. In one variation the n+-doped area 410 may leave some substrate 210 below area 410. In another variation area 410 may vertically extend up to substrate 200.

The doping of area 410 may be performed by using part of the mask applied for patterning the trenches 310 or another suitable mask for shadowing area 210 from being doped with n+ ions.

Trenches 310 are then filled with a highly conductive material such as a metal or a metal-containing conductor, for example, titanium nitride or tungsten or a combination thereof, to form a selection line 420.

Then p+ doped areas 430 are formed as anodes. In one embodiment a mask is deposited on the chip and may be shaped to stripes, such that the mask bares a portion of each n doped substrate area 210, but covers selection line 420. Then p+ ions, which may be any suitable dopant such as BF2, are implanted into the bared portion of the n-doped areas by a conventional implanting method thus producing p+ doped areas 430. The doping energy may be adjusted such that the doped area does not extend into the layer of p-doped substrate 200 for allowing a current to leave the p+ doped area 430 at the bottom side and then to flow laterally to a second selection line. Besides doping the substrate the isolation 220 may be p+ doped, which does not affect the isolation and thus can be disregarded. After the doping process the mask may be removed by a suitable process. In this embodiment the mask can be shaped to maintain a region of n doped substrate 210 between p+ doped areas 430 and the selection lines 420 as illustrated in the figures.

However in an alternative embodiment p+ doped areas 430 may horizontally extend across the top surface of n doped substrate 210 thus adjoining isolation 400. This can be achieved by implanting ions without any masking, such that the p+ ions hit isolation 400 and the top surface of the selection line material. As p+ ions in isolation material do not affect isolation 400 and p+ ions in the selection line material, if they penetrate selection line material at all, do not affect the conducting properties, a mask for shadowing the selection line material may be omitted.

In this way the selection diode for selecting one memory cell from the memory cell array is formed by p+ doped area 430 forming the anode, n-doped area 210 and n+ doped area 410 forming the cathode. As described in the following the memory element of the memory cell is formed and coupled to p+ doped area 430, i.e. vertically on top of the anode. The selection diode of a memory cell in this way couples to the bottom side of the memory element of the cell and with its other end to the bottom side of a selection line.

The memory element may be formed on top of and coupling to the anode, that is to p+ doped area 430, by conventional processes.

Figures 5A, 5B, 5C:
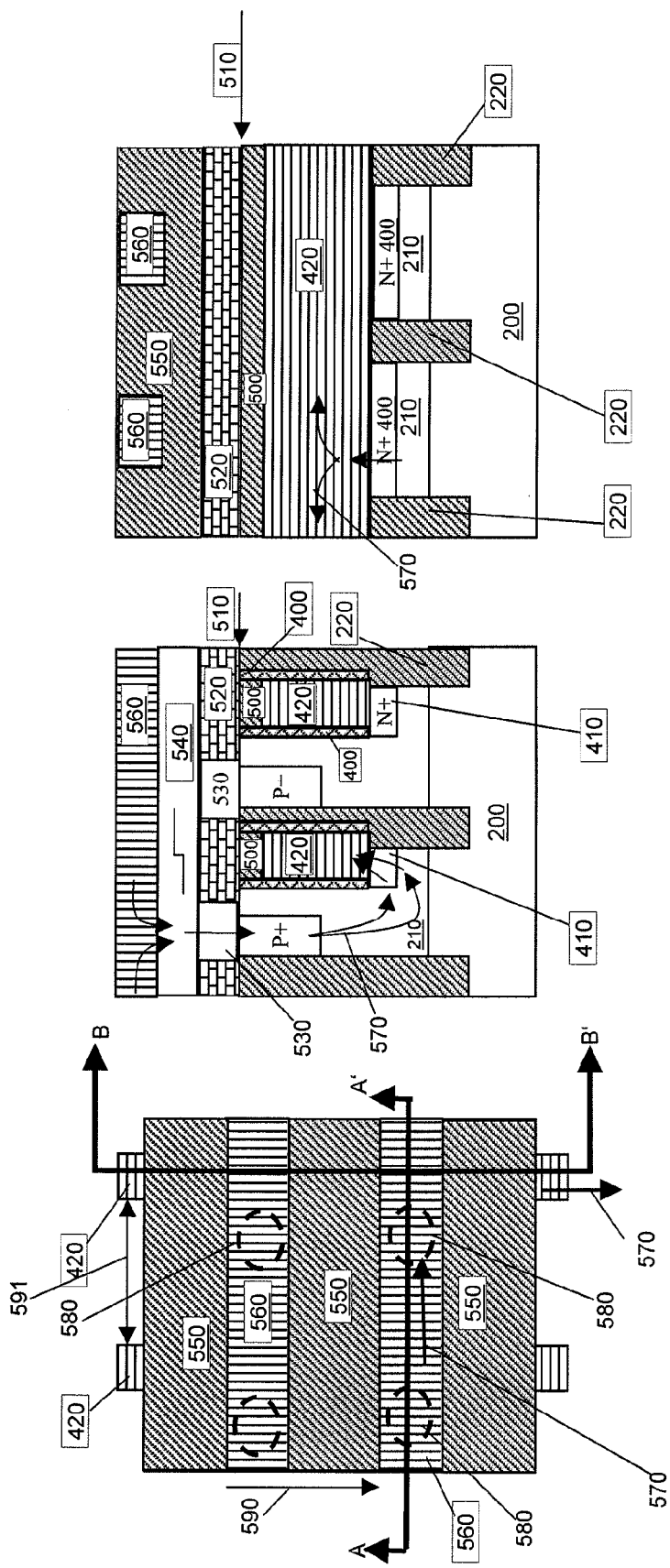
FIGS. 5a, 5b, 5c illustrate a top-down view on and cross sectional views through one embodiment.

Subsequent to filling trench 310 with selection line material the top of the selection line may be covered by suitable isolation. In one embodiment as illustrated in FIGS. 5a to 5c the selection line material can be recessed by a recess etch such that the top of the selection line is below the ridge of the trench. Then a layer of isolating material, for example, such as silicon dioxide may be deposited on the chip to fill up the trench and to form an isolating cap 500 on the line. The selection line is thus located below the original substrate plane, i.e. buried below the original substrate plane, which is indicated by arrow 510.

In one embodiment—not illustrated in the figures for clarity—the selection line material may vertically extend above the original substrate plane, for example, when implementing the selection line as conventional word line stack including at least two materials layered horizontally. Trench 310, for example, may be filled with a conducting material easier to handle, for example, highly doped poly silicon, which forms a first layer of the selection line. On top of the first layer a layer of a second material can be formed, which couples to the first layer and is placed vertically above the plane of the original substrate surface. In one embodiment, the selection line is not buried but vertically extends above the plane of the original surface.

A thin layer of isolating material, e.g., silicon nitride, may then be deposited as middle-of-line (MOL) layer 520 on the chip. Then holes are etched into MOL 520 and filled by a suitable conducting material, for example, tungsten, to form bottom electrode contacts 530. On top of the bottom electrode contacts 530 memory elements 540 of a resistively switching material, e.g., a phase change material such as Germanium-Antimony-Tellurium GST, may be formed. In this embodiment the memory elements may be formed by depositing a layer of suitable material on the chip and shaping the layer into lines perpendicular to selection line 420 and coupled to the bottom electrode contacts 530, wherein the deposition and shaping may be performed by conventional method processes. The interspace between the lines of resistively switching material 540 may be filled with a suitable isolating material 560, for example, such as silicon dioxide. In one embodiment the memory element may also be formed by a damascene technique. After the resistively switching material has been shaped selection lines 570 are formed on top of and coupling to the lines of switching active material 540. The formation of the selection lines and the further processing may be accomplished using conventional method processes, wherein, for example, a conducting layer may be deposited optionally on the switching active material, which couples the material 540 to the selection line.

When operating a memory cell for reading or writing the voltage of selection line 560 with respect to selection line 420 is raised such that a current as indicated by arrow 570 will flow. As illustrated in FIG. 5a the memory elements, the location indicated by circles 580, are located—with respect to a substrate plane—vertically below selection line 560, but not exactly at the intersection of selection lines 420 and 560.

Starting from selection line 560 the current will pass the line of resistively switching material 540 vertically and leave it via a bottom electrode contact 530. A memory element of a memory cell, i.e. element 120, 121 of cell 110, 111 in FIG. 1, is thus defined by a volume within the line, through which the current will flow on its shortest way to the bottom electrode contact of a cell.

From bottom electrode contact 530 the current will flow through the anode 430 and n doped area 210 to cathode 410, which is coupled directly to a highly conductive selection line 420. Corresponding to the location of the p+ and n+ doped areas the current enters the diode having a substantially vertical component, which will subsequently turn to substantially lateral, i.e. parallel to selection line 560, and directed to cathode 410. The current will enter cathode 410 at least at one vertical side and also, if the cathode should leave some substrate 210 vertically below the cathode, from the bottom side of the cathode. In all cases the direction of the current will get a vertical direction directed towards the bottom side of selection line 420, to which the cathode 410 is coupled. The current accordingly enters selection line 420 from its bottom side and is then dissipated by the line, wherein the direction of the current is turned accordingly, such that in FIG. 5b the current flows into or out of the paper plane of the drawing.

With a pitch of 2 F, with F being the smallest possible feature size using available processes, between adjacent first selection lines, see arrow 590, and a pitch of 3 F between adjacent second selection lines, see arrow 591, the area size needed for a memory cell of this embodiment can be estimated to be 6 $F^2$.

Figure 6C:
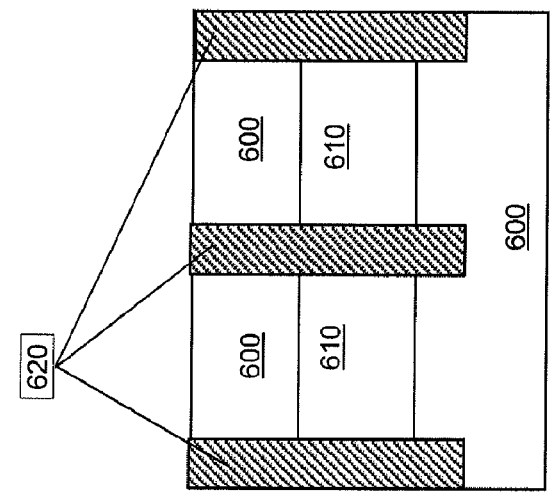
FIGS. 6a, 6b, 6c illustrate a top-down view on and cross sectional views through one embodiment in an early processing stage.
Figure 6B:
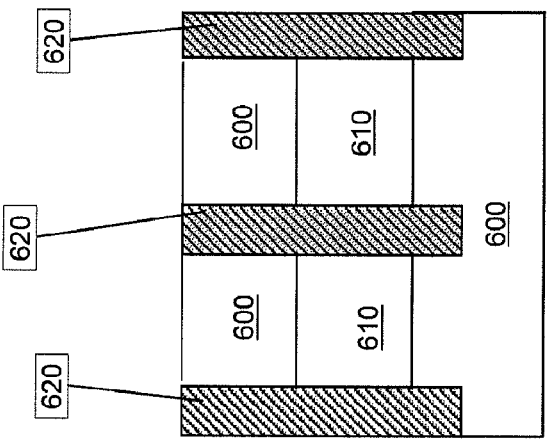
Figure 6A:
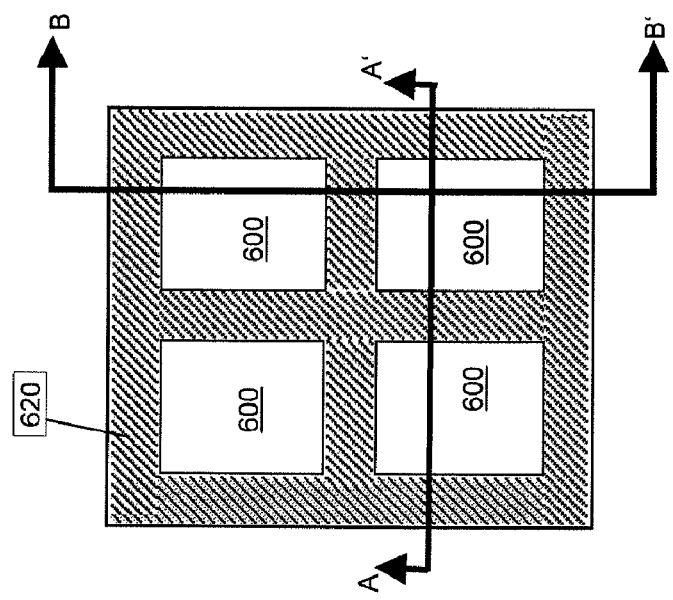

FIGS. 6a to 6c illustrate an early processing stage of a second embodiment. Starting from a p− doped substrate 600 an n− doped layer 610 is produced in the substrate. The substrate may receive also suitable well implants. Layer 610 may be produced by implanting suitable charge carrier ions with suitable implantation energy into substrate 600. In the illustrated embodiment layer 610 may be formed as an intermediate layer, such that layer 610 does not vertically extend to the top surface of substrate 600, but a portion of p− doped substrate 600 remains above n doped layer 610. As the vertical extension of layer 610 can be controlled by the injection energy intermediate layer can be produced by choosing a suitable implantation energy.

After the layer has been produced isolation trenches 620 are produced arranged like a mesh, such that the isolation trenches separate the chip surface into discrete areas, and wherein the trenches vertically extend below the n− doped layer 610 into substrate 600. Subsequently the trenches are filled with a suitable isolating material, for example, silicon dioxide.

Figure 7C:
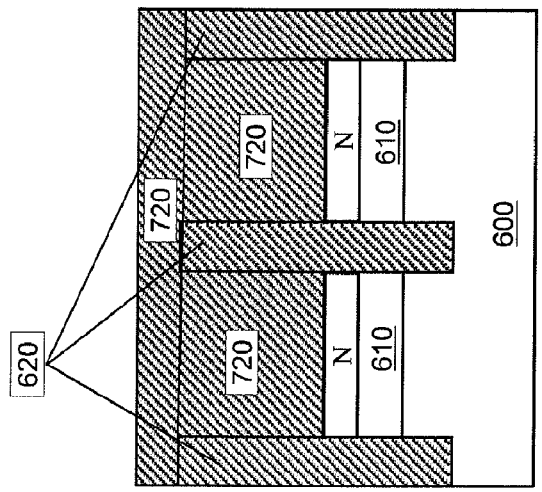
FIGS. 7a, 7b, 7c illustrate a top-down view on and cross sectional views through one embodiment at a later processing stage.
Figure 7B:
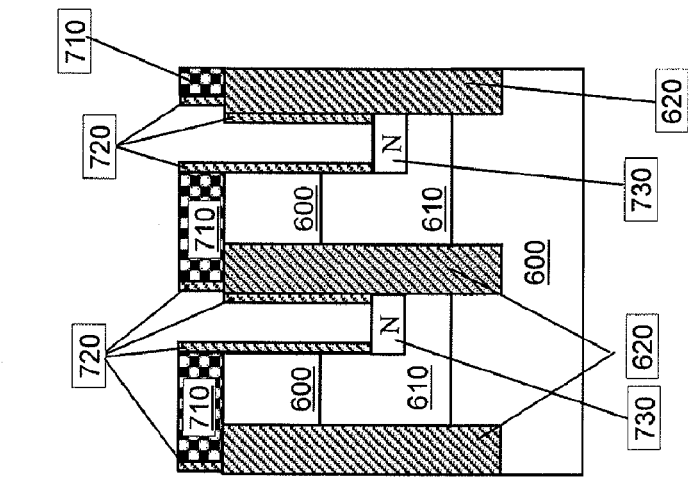
Figure 7A:
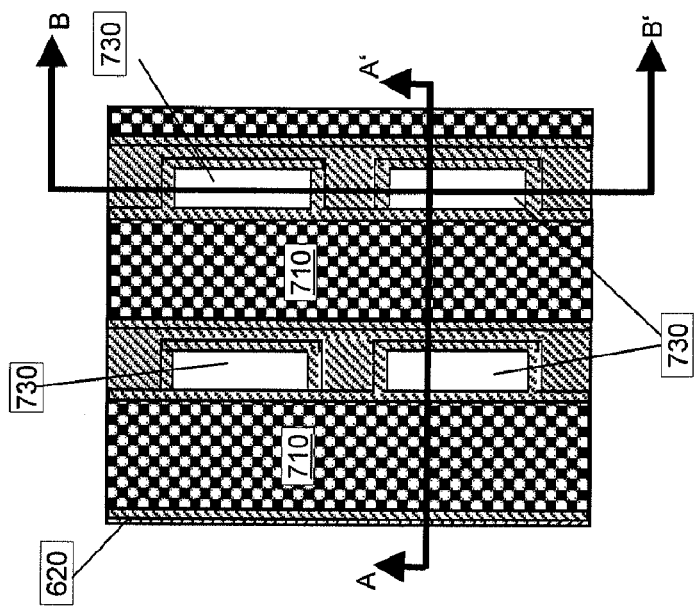

Then selection line trenches 700 are etched into the chip as illustrated in FIGS. 7a-7c. For etching the trenches a mask 710 is deposited and structured using conventional processes, such that the openings of mask 710 adjoin the isolation 620 or overlap with the isolation as illustrated in FIG. 7b.

When etching the selection trenches the etching process can either be non-selective and thus etch both the p− and n− doped substrate and the isolation material deposited in isolation trenches 620 or can be selective to the material 620, such that mainly the p− and n− doped substrate is etched. In any case a trench vertically extends through p− doped substrate 600 into n− doped layer 610.

In case of a non-selective etching the trench continues through isolation trenches 620 and may also laterally extend into isolating material 620 thus forming a trench similar to that described in the previous embodiment.

The figures illustrate the structure after etching selectively, such that material 620 of the isolating trenches remains unaffected. In the direction of the selection line the isolating material 620 accordingly separates a selection line trench into a plurality of grooves, such that there is no continuous trench.

After etching the grooves isolation spacers are produced for isolating the vertical sidewalls of the grooves. The isolation spacers can be produced by depositing a thin liner of a suitable material on the chip, which is then anisotropically etched to remove the liner from horizontal surfaces but maintain the liner on vertical surfaces. Accordingly the bottom of the grooves is not but the vertical sidewalls are covered by thin isolation 720.

Then the bottom of the grooves is n− implanted to produce an n− doped region 730, which forms the cathode of the selection diode, wherein the region may leave some n− doped substrate 610 below or the region may extend to substrate 600.

Subsequently the grooves are filled with conducting material 800, for example, doped poly silicon, wherein the grooves are filled to the original substrate plane, such that the opening in the mask is not filled with poly silicon 800. If necessary a recess etch may be performed to recess the poly silicon to the level. Then a layer of highly conductive material 810, for example, a metal such as tungsten, is deposited on top of poly silicon 800 and shaped into lines coupled to the poly silicon filled grooves 800. In this way a selection line is formed of a continuous line of highly conductive material coupled to the poly silicon filled grooves as in a comb-like structure, where the comb has its teeth directed vertically downwards, confer FIG. 8c.

Then layer 810 is isolated, for example, by forming isolating spacers covering the vertical sidewalls and an isolating cap covering the top of 810 for embedding line 810 in isolating material 890.

After the selection lines and cathode 730 have been formed the anode is produced on top of n doped region 610. Anode 8100 is formed by implanting p+ charge carrier ions into substrate 600 located above n doped region 610, wherein the implantation energy is controlled such that anode 8100 vertically extends from the top surface to the n doped region 610. In this way anode 8100 is coupled to region 610.

The remaining processes for producing the array of memory cells is quite similar to that as described above with respect to the first embodiment, hence these processes are described in the following briefly. Bottom electrode contacts 820 are produced in a dielectric 860 to couple a line of resistively switching material 830 to the selection diodes. The line resistively switching material in turn is coupled to another selection line 840, the selection line 840 running perpendicular to selection line 810.

When selecting one of the memory cells for reading or writing the voltage of selection 840 is raised with respect to the voltage of line 810, such that a current will flow as indicated by arrows 850. Starting from selection line 840 the current is conducted vertically downwards through resistively switching material 830. The current leaves the memory element via bottom electrode contact 820 and then enters into the selection diode, i.e. enters p− doped area 620 forming the anode. The direction of the current flow then gets a lateral component parallel to the direction of selection line 840 and then enters cathode 730 of the selection diode, which is coupled to the bottom of side of protrusion 800, which forms part of the second selection line including line 810 and the poly silicon filled grooves 800. The current is then dissipated by line 810.

FIG. 8a illustrates a top view on the chip, wherein circles 870 denote the locations of the volumes of resistively switching material. Similar to the first one this embodiment discloses that each memory element 830 is coupled with its topside to a first selection line 840 and via a selection diode to a second selection line, wherein the second selection line includes a highly conductive material 810 and is arranged perpendicular to and below the first selection line. The selection diode including p− doped anode 8100 and n− doped cathode 730 couples to the bottom side of the memory element, i.e. the line of switching active material 830 and to the bottom side of the second selection including poly silicon filled grooves 800 and line 810.

Similar to the first embodiment a memory cell of this embodiment takes around 6 $F^2$ of area size, as the pitch between adjacent first selection lines, see arrow 880, and the pitch between adjacent second selection lines, see arrow 881, remain unchanged.

Figure 9C:
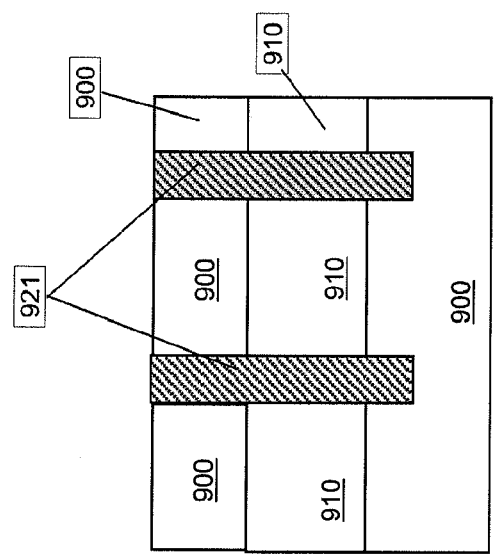
FIGS. 9a, 9b, 9c illustrate a top-down view on and cross sectional views through one embodiment in an early processing stage.
Figure 9B:
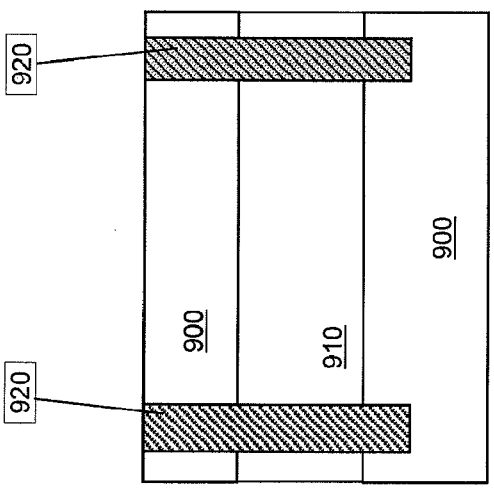
Figure 9A:
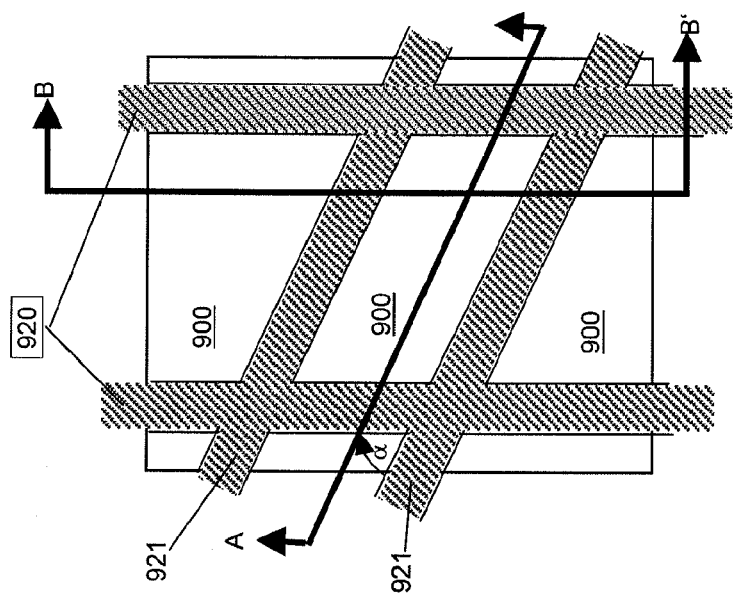

One embodiment discloses a structure wherein two adjacent memory cells share one contact to a selection line. FIGS. 9a to 9c illustrate an early processing stage of this embodiment.

Similar to the described early processing stage of one embodiment and starting from a weakly p− doped substrate 900 an intermediate n− doped layer 910 is formed below p− doped substrate 900, and the chip surface is separated into discrete areas by isolation trenches 920 and 921, which vertically extend below n− doped layer 910. But distinct from the previously described embodiments isolation trenches 920, 921 are not perpendicular, but at a different angle α, with α between 30° to 60°, such that the isolation trenches separate the chip surface into discrete areas each having the shape of a trapezoid, confer FIG. 9a, wherein the final shape may tend to rounded edges due to decreasing dimensions. Note that the cross sectional view of FIG. 9b illustrates a cut line parallel to the angled isolation trenches 921, such that the cut line runs through an active area of a diode.

Figures 10A, 10B, 10C:
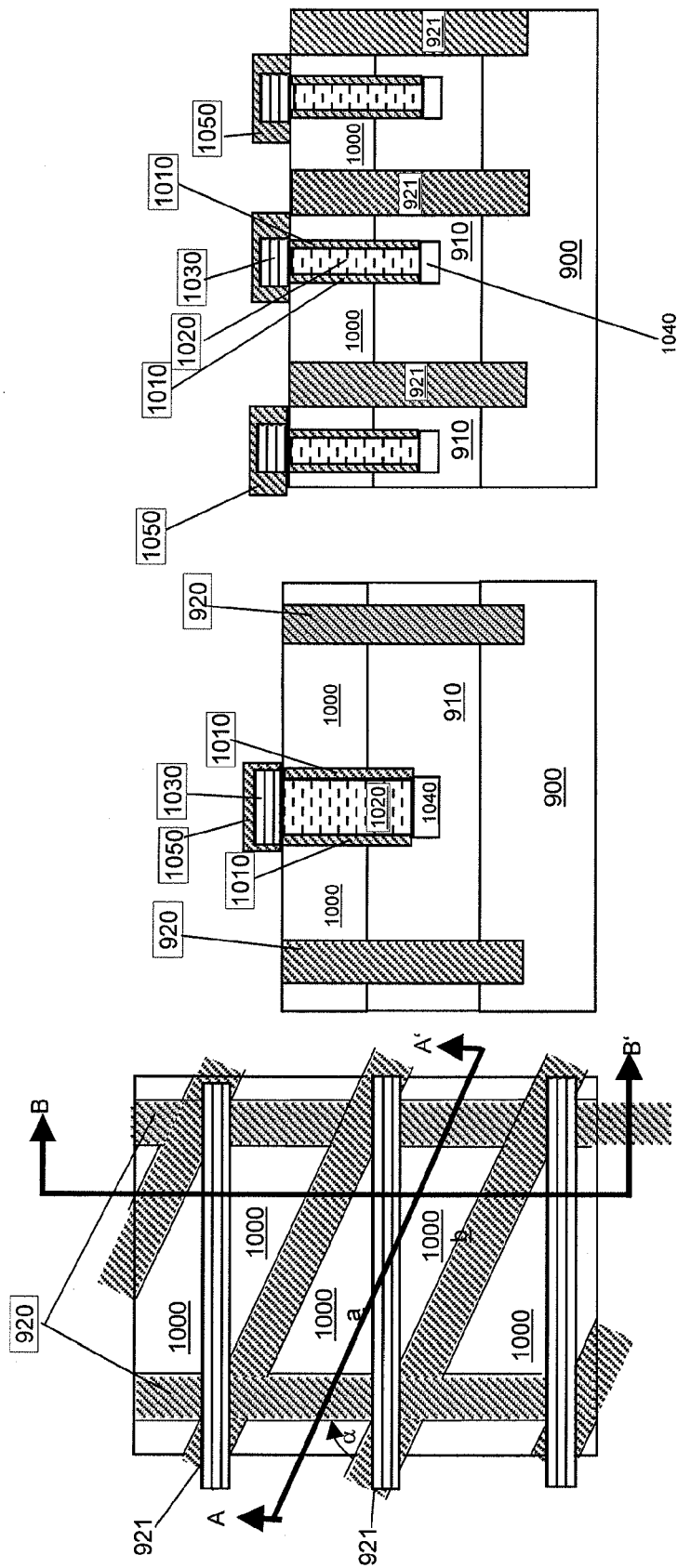
FIGS. 10a, 10b, 10c illustrate a top-down view on and cross sectional views through one embodiment at a later processing stage.

In a following process, as illustrated in FIGS. 10a-10b, continuous selection line trenches are etched through the trapezoid-shaped regions, wherein the trench direction is perpendicular to isolating trenches 920. A trench separates each trapezoid into two areas of equal size and triangular shape, for example, the area in the center of FIG. 10a is separated in two areas 1000a and 1000b respectively.

A selection line trench vertically extends into n− doped area 910. Preferentially a trench does not extend into substrate 900, such that there remains some n− doped substrate 910 below the bottom of the trench.

The vertical sidewalls of the selection line trenches are then electrically isolated by isolating spacers 1010, which can be applied by depositing a liner of isolating material followed by an anisotropic etching process. Then the bottom of a trench may be further n− implanted to form a higher n-doped cathode 1040, which will couple to the selection line in the trench.

Then the trenches are filled with a conducting material 1020, which electrically couples to n-doped material 910 at the bottom of the trench.

In one embodiment, conducting material 1020 may have a high conductivity, such that material 1020 forms a selection line providing sufficient conductivity. In this case the conducting material may be a metal like tungsten. In one embodiment and as illustrated in the drawings a stack of at least two layers of conducting material may be created to form a selection line. A first layer of lower conductivity fills the trench and a second layer of higher conductive material 1030 is applied on top of the first layer. In the illustrated example conducting material 1020 may be highly doped poly silicon and the second layer 1030 of conducting material may be a metal, for example, tungsten.

The top of the selection lines is then isolated, for example, by an isolating layer 1050 on its top and isolating spacers covering the vertical sidewalls.

Similar to the previously described embodiment the anode of the selection diode is formed after the selection lines have been produced. Accordingly regions 1000 are p+ doped by implanting suitable charge carrier ions into the substrate. The implantation energy is controlled such that anode 1000 vertically extends from the top surface to the n doped region 910, such that the anode with its one end couples to cathode region 910 and allows to couple another element to its top surface.

Figures 11A, 11B, 11C:
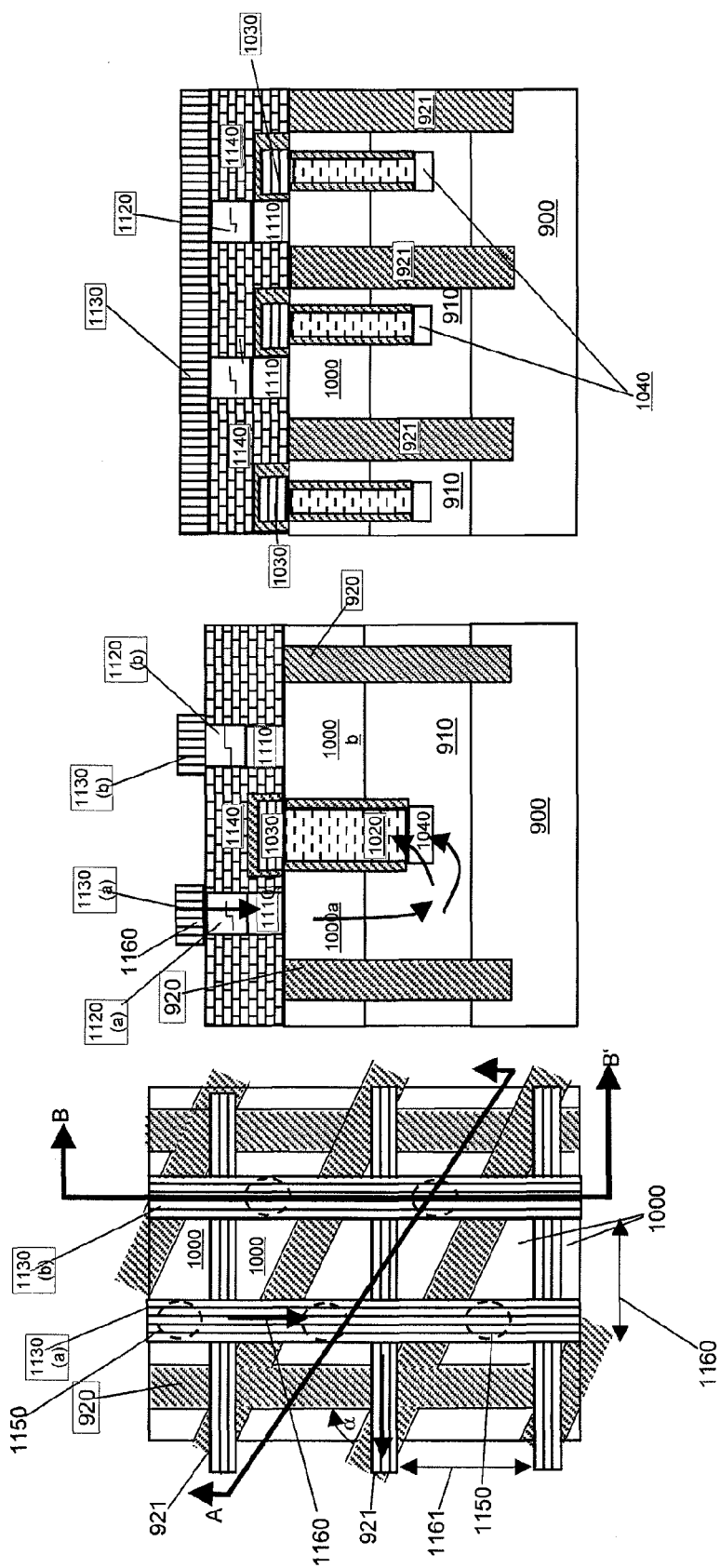
FIGS. 11a, 11b, 11c illustrate the top-down view on and cross sectional views through one embodiment.

Subsequently memory elements and second selection lines are created and coupled to the structure as illustrated in FIGS. 11a-11c, wherein conventional processes can be used. That is on top of each area 1000 a bottom electrode contact 1110 is produced, for example, by etching a corresponding hole into an isolation layer and subsequently filling the hole with a suitable conducting material, for example, a metal. The memory elements, i.e. volumes of resistively switching material 1120, are then formed on top of the bottom electrode contacts 1100, for example, by depositing and structuring a layer of resistively switching material. Lastly selection lines 1130 are produced on top of and coupling to the memory elements, wherein these selection lines are directed perpendicular to those coupling lines 1030. It is apparent in this structure that elements are isolated against each other by isolator 1140, which may include several layers.

Note that in the top view of FIG. 11a the isolation material is not drawn. Furthermore selection lines 1130 hide the volumes of resistively switching material, i.e. the memory elements, as these are arranged below lines 1130. The position of the memory elements below lines 1130 is indicated by circles 1150.

When selecting a memory cell for reading or writing the voltage between lines 1130 and 1030 is raised such that a current flows through the memory element. In the example the current, which is exemplified by arrows 1160 in the figures, flows along the left first selection line 1130 to the selected memory element 1120 coupled to and arranged below the first selection line 1130. Current 1160 then flows vertically—with respect to a substrate plane—down through memory element 1120, then leaves memory element 1120 via bottom contact electrode 1110. Then the current vertically enters the anode of the selection diode, i.e. p− doped substrate 1000a, continues through n− doped cathode portion 910 and enters cathode portion 1040. The current flow enters the second selection line, which in this example includes layers 1020 and 1030, from its bottom side and is dissipated via the second selection line. So for operating memory element 1120 (*a*) selection line 1130(*a*) and selection line 1020, 1030 must be selected.

Similarly for operating memory element 1120(*b*) the combination of selection line 1130(*b*) and selection line 1020, 1030 must be selected. A current flowing from selection line 1130(*b*) will accordingly flow through memory element 1120 (*b*), through anode 1000(*b*) and then enter selection line 1020 from its bottom side. In this way the memory cell including element 1120(*a*) and the cell including element 1120(*b*) share a common contact to selection line 1120.

Although the figures are not drawn to scale the area size needed for one memory cell can be estimated as illustrated by arrows 1160, 1161. As the pitch between the first selection lines can be made as small as 2.5 F and the pitch between adjacent second selection lines as indicated by 1161 can be made as small as 2 F, the area size needed for one memory cell can be made as small as 5 $F^2$.

While the selection device in the previous embodiments has been described as a diode, the structure can also be operated as a bipolar device, if the substrate is regarded as collector. The diode current is then the base current of the bipolar transistor, and part of the current flowing through a memory element does flow into the collector. The wordline accordingly does not have to carry the full current flow.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   an array of memory cells, each cell comprising a resistively switching memory element coupled with its top side to a first selection line and coupled via a selection diode to a second selection line, the second selection line comprising a highly conductive component and arranged perpendicular to and below the first selection line; and
   wherein the selection diode is coupled to the bottom side of the memory element and to the bottom side of the second selection line.

2. The integrated circuit of claim 1, comprising wherein the anode of the selection diode is coupled to the bottom side of the memory element.

3. The integrated circuit of claim 1, comprising wherein the memory element is arranged vertically below the first selection line.

4. The integrated circuit of claim 1, comprising wherein a second selection line forms protrusions directed vertically downwards, each protrusion being coupled to a selection diode.

5. The integrated circuit of claim 1, comprising wherein a first and a second memory cell are coupled to a common connection coupled to a second selection line.

6. The integrated circuit of claim 1, comprising wherein the resistively switching memory element is a phase change memory element.

* * * * *